(12) United States Patent
Kawagoe et al.

(10) Patent No.: US 8,523,411 B2
(45) Date of Patent: Sep. 3, 2013

(54) LIGHT SOURCE DEVICE

(75) Inventors: Shinya Kawagoe, Osaka (JP); Naotaka Hashimoto, Osaka (JP); Kuninori Takezawa, Shiga (JP); Kazuhiko Itoh, Osaka (JP); Hayato Kameyama, Osaka (JP)

(73) Assignee: Panasonic Corporation, Osaka (JP)

( * ) Notice: Subject to any disclaimer, the term of this patent is extended or adjusted under 35 U.S.C. 154(b) by 46 days.

(21) Appl. No.: 13/390,913

(22) PCT Filed: Feb. 22, 2011

(86) PCT No.: PCT/JP2011/000979
§ 371 (c)(1),
(2), (4) Date: Feb. 16, 2012

(87) PCT Pub. No.: WO2011/105049
PCT Pub. Date: Sep. 1, 2011

(65) Prior Publication Data
US 2012/0147608 A1    Jun. 14, 2012

(30) Foreign Application Priority Data
Feb. 23, 2010    (JP) .................................. 2010-036933

(51) Int. Cl.
*F21V 33/00*    (2006.01)

(52) U.S. Cl.
USPC ....................... 362/373; 362/294; 362/311.02

(58) Field of Classification Search
USPC .................... 362/373, 294, 547, 374, 249.02, 362/311.02, 545
See application file for complete search history.

(56) References Cited

U.S. PATENT DOCUMENTS

| | | | |
|---|---|---|---|
| 7,549,772 B2 * | 6/2009 | Wang | 362/294 |
| 2005/0207166 A1 * | 9/2005 | Kan et al. | 362/373 |
| 2006/0227558 A1 | 10/2006 | Osawa et al. | |
| 2007/0019409 A1 | 1/2007 | Nawashiro et al. | |
| 2010/0026157 A1 | 2/2010 | Tanaka et al. | |
| 2010/0237761 A1 | 9/2010 | Osawa et al. | |
| 2010/0237779 A1 | 9/2010 | Osawa et al. | |
| 2010/0244650 A1 | 9/2010 | Osawa et al. | |
| 2010/0244694 A1 | 9/2010 | Osawa et al. | |
| 2010/0253200 A1 | 10/2010 | Osawa et al. | |
| 2011/0049749 A1 * | 3/2011 | Bailey et al. | 264/167 |
| 2011/0089806 A1 | 4/2011 | Suwa et al. | |

(Continued)

FOREIGN PATENT DOCUMENTS

| | | |
|---|---|---|
| JP | 3099033 | 3/2004 |
| JP | 2007-059378 | 3/2007 |

(Continued)

*Primary Examiner* — Laura Tso

(57) ABSTRACT

An aim is to provide a light source device that can be assembled more easily than conventional light source devices. A light source device 100 comprises a light emitting module 150, a mount 140, a lighting unit 110, and a case 120, wherein the lighting unit 110 has a pair of pin terminals 112a and 112b, each of the mount 140 and a substrate 151 of the light emitting module 150 has a pair of through-holes 154a and 154b, and a pair of feed terminals 153a and 153b are disposed at positions of the substrate 151 corresponding to the through-holes 154a and 154b, the pair of pin terminals 112a and 112b being electrically connected to the pair of feed terminals 153a and 153b by penetrating through the through-holes 154a and 154b of the mount 140 and the substrate 151.

19 Claims, 16 Drawing Sheets

(56) References Cited

U.S. PATENT DOCUMENTS

2011/0156569 A1 6/2011 Osawa
2011/0176298 A1* 7/2011 Meurer et al. ................ 362/218
2011/0309386 A1 12/2011 Osawa et al.
2011/0310606 A1 12/2011 Osawa et al.

FOREIGN PATENT DOCUMENTS

| | | |
|---|---|---|
| JP | 2007-188832 | 7/2007 |
| JP | 2009-093926 | 4/2009 |
| JP | 2009-206104 | 9/2009 |
| JP | 2010-033959 | 2/2010 |
| WO | 2009/157285 | 12/2009 |

* cited by examiner

LIGHT SOURCE DEVICE

TECHNICAL FIELD

The present invention relates to a light source device having a light emitting element, such as an LED (light emitting diode), as a light source.

BACKGROUND ART

In recent years, high luminance LEDs have been in practice use. Accordingly, an attempt has been made to use a light source device having an LED as a light source, as a substitute for a halogen light bulb or an incandescent light bulb (See Patent Literatures 1 and 2).

Generally, such a light source device has the following structure. That is, an LED module is mounted on one side of a mount. The mount is made of a heat dissipating material such as aluminum. A cover for covering the LED module is attached to the mount. Also, a case made of an insulating material, such as resin, is attached to another side of the mount located opposite from the side on which the LED module is mounted. A lighting unit for lighting the LED module is housed in the case, and a base is attached to a side of the case opposite from a side of the case to which the mount is attached.

CITATION LIST

Patent Literature

[Patent Literature 1]
Japanese Patent Application Publication No. 2009-093926
[Patent Literature 2]
Japanese Patent Application Publication No. 2010-033959

SUMMARY OF INVENTION

Technical Problem

In an assembling process of such a light source device as described above, the LED module and the lighting unit disposed on the respective sides of the mount need to be electrically connected to each other. In order to do so, it is necessary to include a process of inserting a lead wire of the light unit into a through-hole pierced through the mount in advance, and connecting the lead wire to a feed terminal of the LED module. Also, it is necessary to include a process of attaching, to the mount, a plurality of components such as the LED module and the case, while adjusting the positions of the components. Such processes are complicated and lower the work efficiency of assembling; therefore, there is a demand for a light source device which can be assembled easily.

The present invention has been achieved in view of the above problems, and an aim thereof is to provide a light source device that can be assembled more easily than conventional light source devices.

Solution to Problem

In order to solve the above problems, one aspect of the present invention is a light source device comprising: a light emitting module having a light emitting element and a substrate on which the light emitting element is mounted; a mount on which the light emitting module is mounted; a lighting unit for lighting the light emitting module; and a case housing therein the lighting unit and being disposed opposite the light emitting module with respect to the mount, wherein the lighting unit has a pair of pin terminals, each of the mount and the substrate has a pair of through-holes, and a pair of feed terminals are disposed at positions of the substrate corresponding to the through-holes, the pair of pin terminals being electrically connected to the pair of feed terminals by penetrating through the through-holes of the mount and the substrate.

Another aspect of the present invention is a light source device comprising: a light emitting module having a light emitting element and a substrate on which the light emitting element is mounted; a mount on which the light emitting module is mounted; a lighting unit for lighting the light emitting module; and a case housing therein the lighting unit and being disposed opposite the light emitting module with respect to the mount, wherein a pair of connectors are attached to the light emitting module and protrude from the substrate toward an opposite side from the light emitting element, and the mount has a pair of through-holes, each of the connectors including an engaging member and being engaged with the lighting unit by the engaging member in a state where the pair of connectors penetrate through the pair of through-holes, and the light emitting module is electrically connected to the lighting unit.

Advantageous Effects of Invention

The light source device according to the one aspect of the present invention has a structure where the pair of pin terminals of the lighting unit are electrically connected to the pair of feed terminals of the light emitting module in the state where the pair of pin terminals of the lighting unit penetrate through the through-holes of the mount and the substrate. This makes it possible to fix each of the pair of pin terminals at a predetermined position with respect to the substrate, and to fix each of the light emitting module and the case to a predetermined position with respect to the mount, by simply inserting the pair of pin terminals through the pair of through-holes of each of the mount and the substrate.

The light source device according to the other aspect of the present invention has a structure where the pair of connectors attached to the light emitting module are engaged with the lighting unit in the state where the pair of connectors penetrate through the pair of through-holes of the mount, and the lighting unit and the light emitting module are electrically connected to each other. This makes it possible to fix each of the pair of connectors at a predetermined position with respect to the lighting unit, and to fix each of the light emitting module and the case to a predetermined position with respect to the mount, by simply inserting the pair of connectors through the pair of through-holes of the mount.

Accordingly, the light source device according to any of the aspects described above has a structure that makes it easy to establish the electric connection between the lighting unit and the light emitting module, and that makes it easy to attach the light emitting module and the case to the base. This facilitates the assembly of the light source device.

DESCRIPTION OF EMBODIMENTS

The following describes embodiments of a light source device according to the present invention with reference to the attached drawings.

Embodiment 1

Overall Structure

Figure 1:
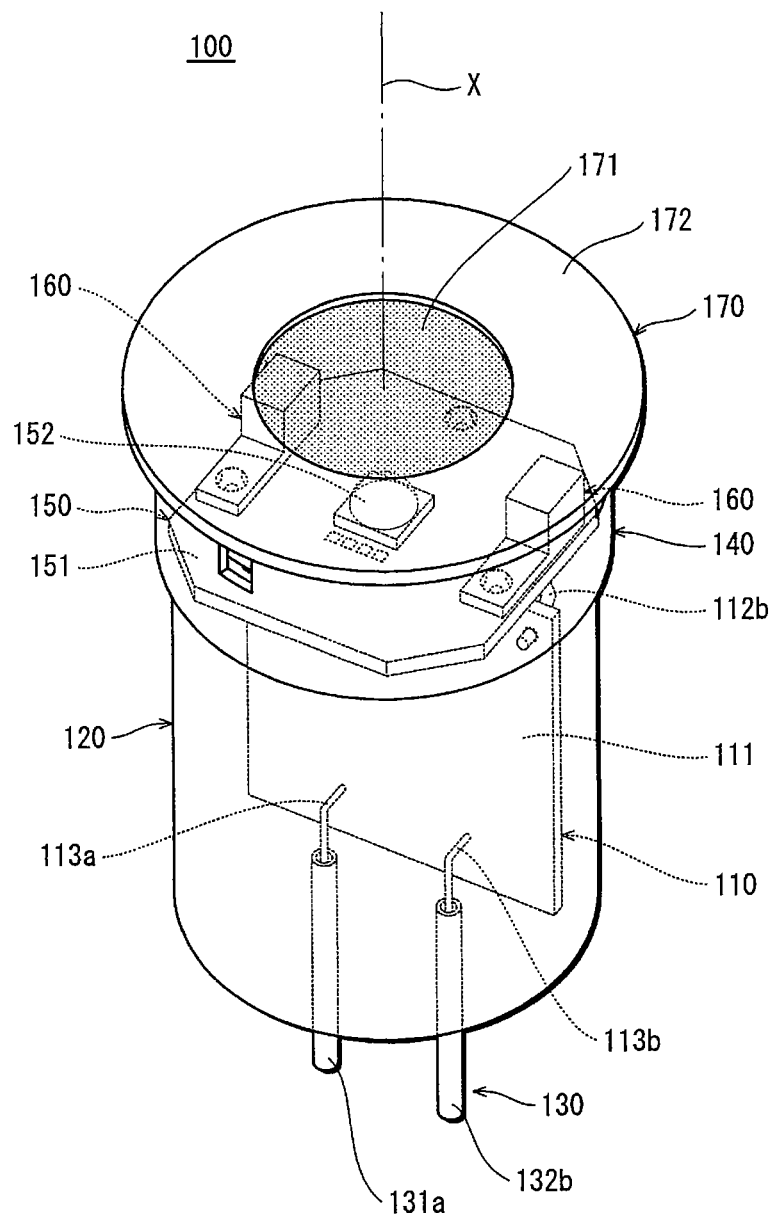
FIG. 1 is a perspective view showing a light source device according to Embodiment 1.
Figure 2:
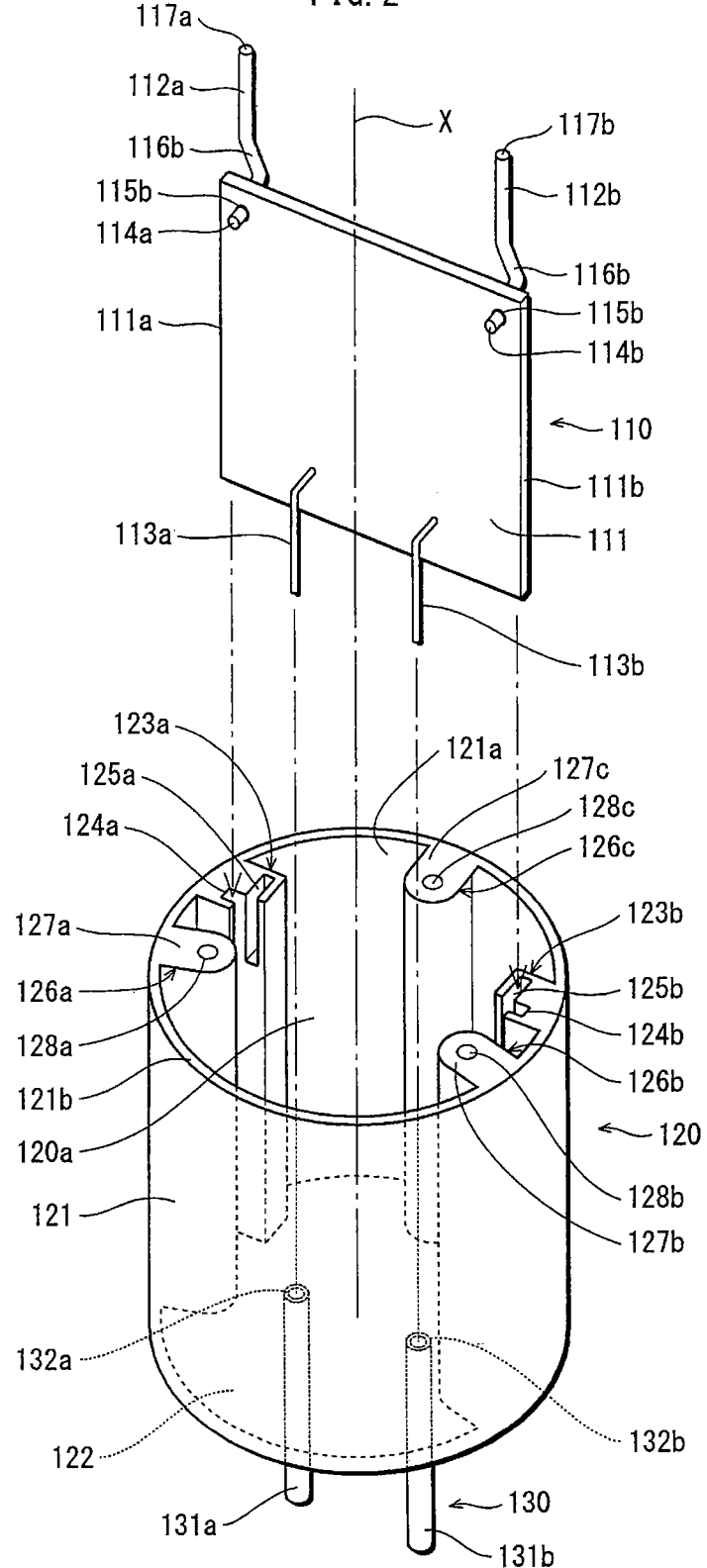
FIG. 2 is an exploded perspective view for explaining a procedure of assembling the light source device according to Embodiment 1.
Figure 3:
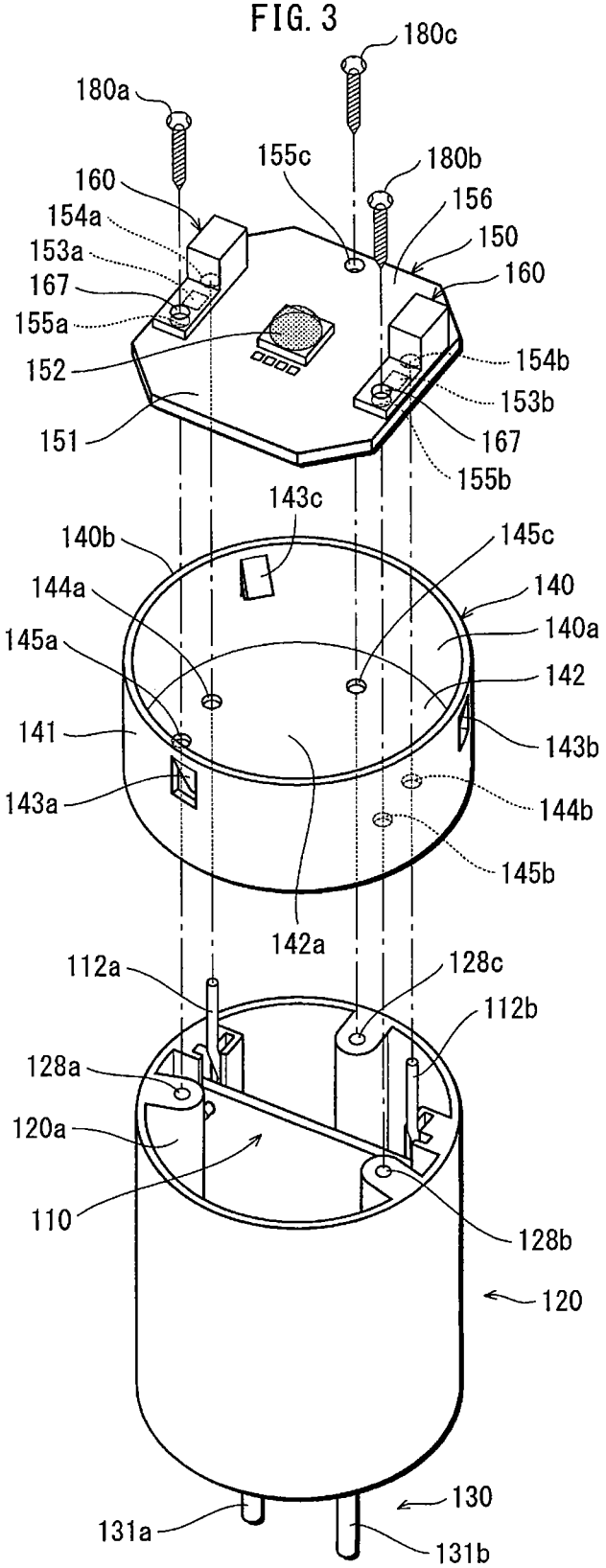
FIG. 3 is an exploded perspective view for explaining a procedure of assembling the light source device according to Embodiment 1.
Figure 4:
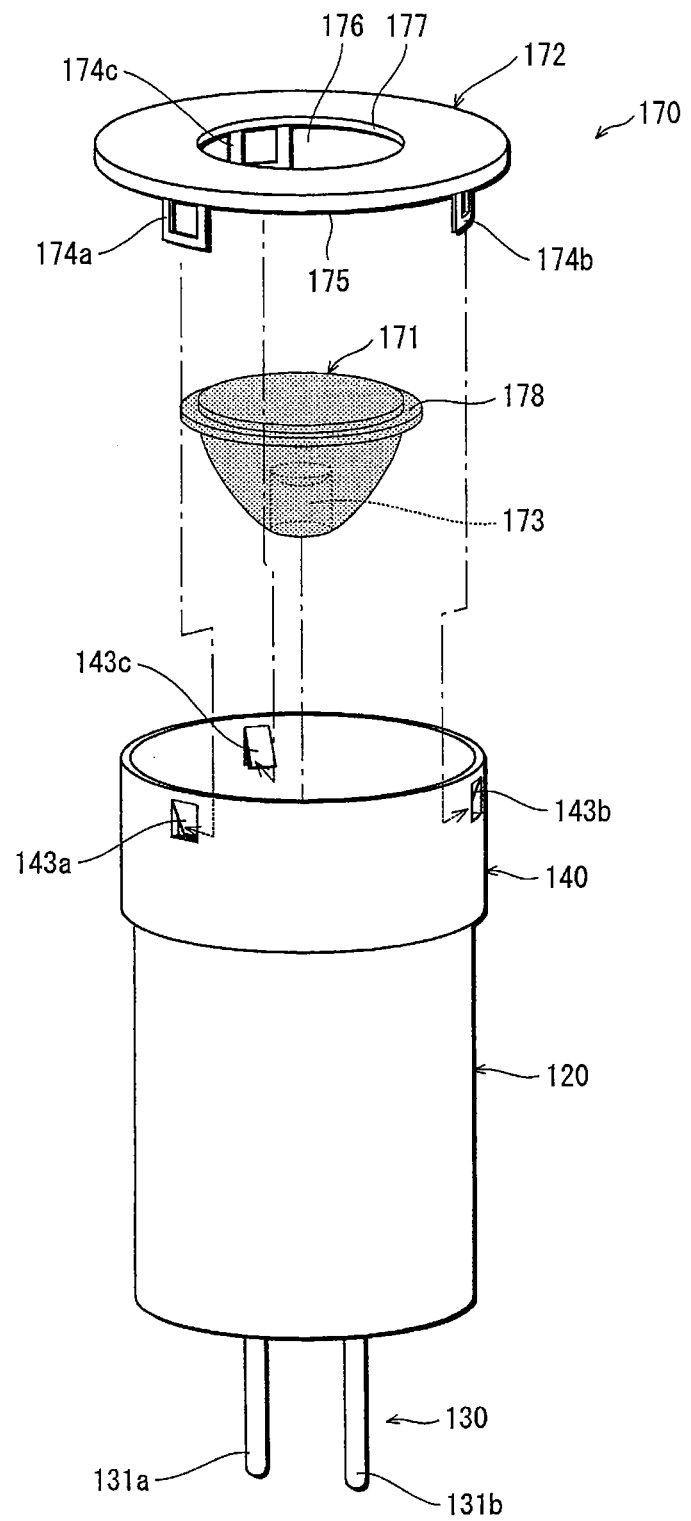
FIG. 4 is an exploded perspective view for explaining a procedure of assembling the light source device according to Embodiment 1.

FIG. 1 is a perspective view of a light source device according to Embodiment 1. FIGS. 2 to 4 are exploded perspective views for explaining a procedure of assembling the light source device according to Embodiment 1.

As shown in FIG. 1, a light source device 100 according to Embodiment 1 is a substitute for a halogen spotlight, and includes a lighting unit 110, a case 120, a base 130, a mount 140, an LED module (light emitting module) 150, a pair of connectors 160, and a cover 170. Note that a halogen light bulb is a light bulb defined in JIS C7527.

(Lighting Unit)

The lighting unit 110 includes, for example, a lighting circuit composed of: a rectifier circuit for rectifying an AC power supplied from a commercial power source to a DC power; a voltage adjustment circuit for adjusting a voltage value of the DC power rectified by the rectifier circuit; and so on. The lighting unit 110 causes the LED module 150 to emit light with use of the commercial power source.

As shown in FIG. 2, the lighting unit 110 includes a circuit board 111, a pair of pin terminals 112a and 112b, and a pair of wires 113a and 113b. The circuit board 111 has a rectangular plate-like shape and has mounted thereon a plurality of electronic components (not shown) such as a diode bridge, an electrolytic capacitor, a differential amplifier, and a microcomputer. The pin terminals 112a and 112b are provided to be electrically connected to the LED module 150. The wires 113a and 113b are provided to be electrically connected to the base 130.

The pin terminals 112a and 112b are connected to a wiring pattern (not shown) formed on the circuit board 111 by soldering or welding, in a state where proximal ends 114a and 114b of the pin terminals 112a and 112b are inserted into mounting holes 115a and 115b formed in the circuit board 111. With the pin terminals 112a and 112b being inserted into the mounting holes 115a and 115b of the circuit board 111, the load imposed on the pin terminals 112a and 112b can escape to the circuit board 111. This allows portions at which the pin terminals 112a and 112b are connected to the wiring pattern to be resistant to breaking.

Also, the proximal ends 114a and 114b of the pin terminals 112a and 112b have bent portions 116a and 116b which are bent into a hook. Since the load imposed on the pin terminals 112a and 112b is dispersed by the bent portions 116a and 116b, the portions at which the pin terminals 112a and 112b are connected to the wiring pattern are even more resistant to breaking.

The pin terminals 112a and 112b serve not only as feed terminals for supplying power to the LED module 150, but also as positioning pins for positioning the mount 140 and the LED module 150 with respect to the case 120. Specifically, the pin terminals 112a and 112b are inserted through through-holes 144a and 144b of the mount 140 and through through-holes 154a and 154b of the LED module 150, whereby the mount 140 and the LED module 150 are positioned with respect to the case 120.

To serve as the positioning pins, distal ends (tip ends) 117a and 117b of the pin terminals 112a and 112b protrude from the case 120. The length of the protruding portion of each of the pin terminals 112a and 112b is preferably in the range of 1 mm to 5 mm inclusive. If the length is shorter than the aforementioned range, it is difficult to insert the pin terminals 112a and 112b through the through-holes 144a and 144b of the mount 140 and the through-holes 154a and 154b of the LED module 150. If the length is longer than the aforementioned range, the distal ends 117a and 117b of the pin terminals 112a and 112b protrude excessively from a substrate 151 of the LED module 150 and are thus a hindrance.

Also, since serving as the positioning pins, the pin terminals 112a and 112b have a bend strength that enables the pin terminals 112a and 112b not to be bent when inserted through the through-holes 144a and 144b of the mount 140 and the through-holes 154a and 154b of the LED module 150. Specifically, as an example of such a bend strength, if the pin terminals 112a and 112b are made of nickel, the outer diameter of each of the pin terminals 112a and 112b is preferably greater than or equal to 0.5 mm.

(Case)

The case 120 has, for example, a bottomed cylindrical shape of which the lower end is closed and the upper end is open. The case 120 includes a cylindrical portion 121 and a bottom portion 122 that has a disc shape and closes the lower end of the cylindrical portion 121. The case 120 is made of an insulating material such as resin or ceramic.

The cylindrical portion 121 has an inner circumferential surface 121a on which a pair of protrusions 123a and 123b are formed. The protrusions 123a and 123b are formed along an axis X of the case 120 (i.e., an axis of the cylindrical portion 121). Also, a pair of rail grooves 124a and 124b that oppose each other are formed in the protrusions 123a and 123b along the axis X.

Regarding the lighting unit 110, side edges 111a and 111b (i.e., left and right side edges in FIG. 2) of the circuit board 111 are respectively fit into the rail grooves 124a and 124b. In this way, the lighting unit 110 is fixed inside the case 120. As a result, the pin terminals 112a and 112b of the lighting unit 110 are located at a predetermined position with respect to the case 120.

As described above, the light source device 100 has a structure in which the circuit board 111 is fixed with use of the rail grooves 124a and 124b. This makes it possible to arrange the lighting unit 110 at a predetermined position inside the case 120 by simply sliding the circuit board 111 along the rail grooves 124a and 124b, and to easily assemble and disassemble the case 120 and the lighting unit 110.

Note that it is preferable to appropriately adjust the width of each of the rail grooves 124a and 124b according to the thickness of the circuit board 111. For example, the width of each of the rail grooves 124a and 124b is preferably 0.1 mm to 0.5 mm larger than the thickness of the circuit board 111. If the width of each of the rail grooves 124a and 124b is larger than the thickness of the circuit board 111 by more than 0.5 mm, the lighting unit 110 is likely to rattle in the case 120. If the width of each of the rail grooves 124a and 124b is larger than the thickness of the circuit board 111 by less than 0.1 mm, it is difficult to fit the side edges 111a and 111b of the circuit board 111 into the rail grooves 124a and 124b.

The protrusions 123a and 123b has further formed therein recesses 125a and 125b for receiving the bent portions 116a and 116b of the pin terminals 112a and 112b. With this structure, when the circuit board 111 is fit into the rail grooves 124a and 124b, the bent portions 116a and 116b do not hit the protrusions 123a and 123b and become a hindrance.

On the inner circumferential surface 121a of the cylindrical portion 121, three protrusions 126a to 126c are formed at equal intervals in the circumferential direction while avoiding the protrusions 123a and 123b. Also, screw holes 128a to 128c are respectively formed in upper surfaces 127a to 127c of the protrusions 126a to 126c. Note that: the upper surfaces 127a to 127c of the three protrusions 126a to 126c are flush with an upper surface 121b of the cylindrical portion 121; there is no gap between the three protrusions 126a to 126c and the mount 140 in a state where the mount 140 is in contact with the upper surface 121b of the cylindrical portion 121; and an opening 120a of the case 120 is closed by the mount 140.

(Base)

The base 130 is composed of a pair of base pins 131a and 131b which conform to "GU5.3" defined in JIS C 7709 and are adaptable to a socket for a halogen light bulb. The base pins 131a and 131b are arranged at the bottom portion 122 and protrude outside the case 120 from a lower surface of the bottom portion 122. The base pins 131a and 131b respectively include hollows 132a and 132b. The wires 113a and 113b of the lighting unit 110 are respectively inserted into the hollows 132a and 132b, and are electrically connected to the base pins 131a and 131b by swaging or soldering. Note that a base according to the present invention is not limited to the pin bases of "GU5.3", and may be pin bases of "GU10" or an Edison base such as "E26".

(Mount)

As shown in FIG. 3, the mount 140 has, for example, a bottomed cylindrical shape of which the lower end is closed and the upper end is open. The mount 140 includes a cylindrical portion 141 and a bottom portion 142 that has a disc shape and closes the lower end of the cylindrical portion 141. The mount 140 is made of a heat dissipating material such as metal or ceramic (including glass).

Latching claws 143a to 143c are formed at three different portions of the cylindrical portion 141, at equal intervals in the circumferential direction. The latching claws 143a to 143c are formed as follows. First, predetermined portions of the cylindrical portion 141 are punched out substantially in a U shape to form tongues. Then, the tongues are bent inward to form the latching claws 143a to 143c. As shown in FIG. 4, the latching claws 143a to 143c are respectively engaged with claw receiving portions 174a to 174c of the cover 170 when the cover 170 is attached to the mount 140.

The LED module 150 is mounted on an upper surface 142a of the bottom portion 142 of the mount 140, which is an inner bottom surface of the mount 140. Also, the through-holes 144a and 144b for inserting the pin terminals 112a and 112b therethrough are formed in the bottom portion 142. A gap between the through-holes 144a and 144b is the same as a gap between the pin terminals 112a and 112b. In a state where the light source device 100 has been assembled, the pin terminals 112a and 112b penetrate through the through-holes 144a and 144b.

Also, three screw holes, i.e., screw holes 145a to 145c, are formed in the bottom portion 142. The screw holes 145a to 145c are for fixing the mount 140 to the case 120. In a state where the light source device 100 has been assembled, the screw holes 145a to 145c of the mount 140 are respectively in communication with the screw holes 128a to 128c of the case 120.

(LED Module)

The LED module 150 is a light source of the light source device 100, and includes, for example, the substrate 151, an LED (light emitting element) 152, and a pair of feed terminals 153a and 153b.

The substrate 151 is substantially in an octagonal plate-like shape, for example, and has a two-layer structure including an insulating layer and a metal layer. The insulating layer is made of ceramic, a heat-conductive resin, or the like. The metal layer is made of aluminum, or the like.

A wiring pattern (not shown) to be electrically connected to the LED 152 is formed on the substrate 151. Also, the through-holes 154a and 154b and three screw holes, i.e., screw holes 155a to 155c are formed in the substrate 151 while avoiding the wiring pattern. The through-holes 154a and 154b are for inserting the pin terminals 112a and 112b therethrough. The screw holes 155a to 155c are for attaching the LED module 150 to the mount 140.

In a state where the light source device 100 has been assembled, the pin terminals 112a and 112b penetrate through the through-holes 154a and 154b, and the screw holes 155a to 155c are respectively in communication with the screw holes 145a to 145c of the mount 140. A gap between the through-holes 154a and 154b is the same as a gap between the pin terminals 112a and 112b.

The LED 152 includes, for example, an InGaN-based LED chip that emits blue light, and a sealing member that includes a phosphor that emits yellow-green light and seals the LED chip. The LED 152 converts a part of the blue light emitted from the LED chip to yellow-green light by the phosphor, and emits white light generated as a mixture of the blue light and the yellow-green light. The LED 152 is mounted on the substrate 151, and is electrically connected to the wiring pattern of the substrate 151 via a wire (not shown).

The feed terminals 153a and 153b are disposed at portions corresponding to the through-holes 154a and 154b. Specifically, the feed terminal 153a is formed on an upper surface 156 of the substrate 151 and between the through-hole 154a and the screw hole 155a. The feed terminal 153b is formed on the upper surface 156 of the substrate 151 and between the through-hole 154b and the screw hole 155b. The feed terminals 153a and 153b are electrically connected to the LED 152 via the wiring pattern of the substrate 151.

(Connector)

Figure 5:
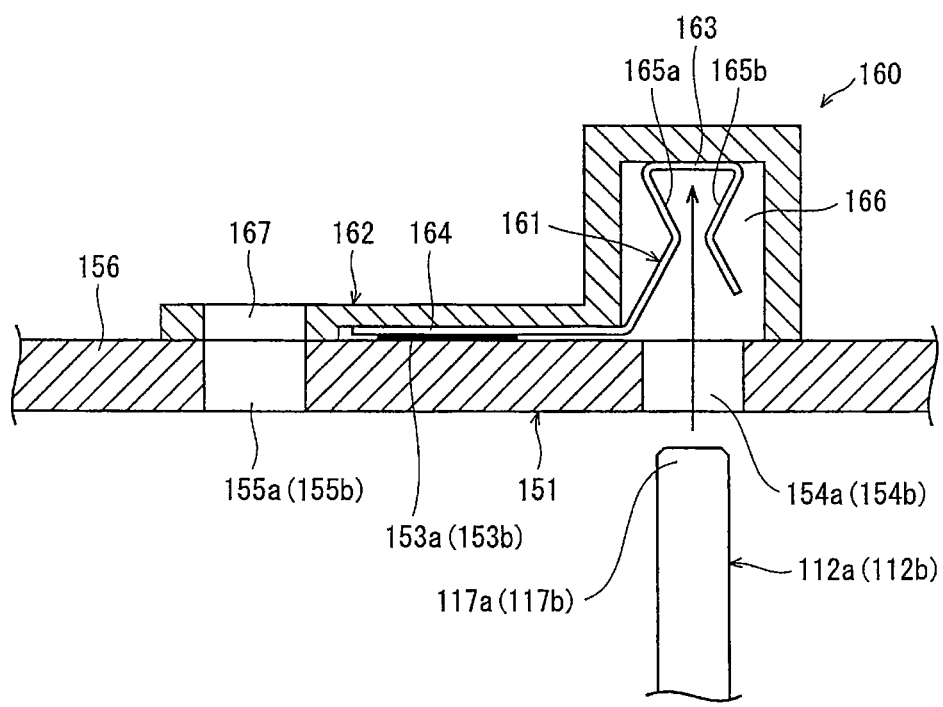
FIG. 5 is a sectional view for explaining the inner structure of connectors.

The pair of connectors 160 electrically connect the lighting unit 110 to the LED module 150. FIG. 5 is a sectional view for explaining the inner structure of the connectors 160. As shown in FIG. 5, each of the connectors 160 includes: a conductive member 161 for electrically connecting the pin terminal 112a (112b) to the feed terminal 153a (153b); and a covering member 162 which is insulative and covers the conductive member 161. Each of the connectors 160 is mounted on the upper surface 156 of the substrate 151, in an area spanning between the through-hole 154a (154b) and the screw hole 155a (155b).

Each of the conductive members 161 includes: an end 163 to be electrically connected to the pin terminal 112a (112b); and an end 164 to be electrically connected to the feed terminal 153a (153b). Each of the ends 163 includes a pair of plate springs 165a and 165b that oppose each other, and is positioned above the through-hole 154a (154b) of the substrate 151. When the distal end 117a (117b) of the pin terminal 112a (112b) is inserted between the plate springs 165a and 165b, the pin terminal 112a (112b) is supported by the pressure of the plate springs 165a and 165b. Each of the ends 164 has a flat plate-like shape, and is positioned on the feed terminal 153a (153b) and connected thereto by soldering or the like.

Each of the covering members 162 is fixed to the upper surface 156 of the substrate 151 by an adhesive or the like so as to cover the conductive member 161. Each of the covering members 162 has a recess 166 for housing the plate springs 165a and 165b, and is located at a position corresponding to the through-hole 154a (154b). Also, each of the covering members 162 includes a screw hole 167 that is in communication with the screw hole 155a (155b) of the substrate 151.

Note that the electric connection between the lighting unit 110 and the LED module 150 is not limited to being established via the connectors 160. Instead, it may be established by soldering or the like.

(Cover)

As shown in FIG. 4, the cover 170 is attached to the mount 140 so as to cover the LED module 150 and close an opening 140a of the mount 140. The cover 170 includes a lens (optical component) 171 and a frame 172 that surrounds the lens 171.

The lens 171, for example, is made of transparent acrylic resin and substantially in an inverted frusto-conical shape. The lens 171 has a recess 173 that is substantially in a columnar shape and located at the center of a lower portion of the lens 171. The lower portion of the lens 171 is in contact with the LED 152 in a state where a portion of the LED 152 is fit into the recess 173. With the portion of the LED 152 being fit into the recess 173 of the lens 171, the lens 171 is restricted from moving in a direction perpendicular to the axis X. The material of the lens 171 is not limited to the transparent acrylic resin, but may be other light-transmissive resin or a light-transmissive material such as glass.

Light emitted from the LED 152 is received by the lens 171, then converged and emitted outside by the lens 171. When the light of the LED 152 is converged and used as a spotlight, it is preferable that the LED 152 has a beam angle of 140° or smaller to facilitate the convergence of light.

The frame 172, for example, is made of non-translucent resin and has a flat disc shape. The frame 172 has the claw receivers 174a to 174c along a circumferential edge thereof, at equal intervals in the circumferential direction. The frame 172 is fixed by the claw receivers 174a to 174c being engaged with the latching claws 143a to 143c of the mount 140, in a state where a lower surface 175 of the frame 172 is in contact with an upper surface 140b of the mount 140. Note that it is not always necessary to use the latching claws 143a to 143c and the claw receivers 174a to 174c to attach the frame 172 to the mount 140. Instead, it is possible to use a known attachment method with an adhesive, a screw, or the like.

The lens 171 is positioned at an opening 176 in the center of the frame 172. An inner circumferential edge 177 of the frame 172 pushes an outer circumferential edge 178 of the lens 171 toward the LED module 150, whereby the lens 171 is pushed toward the mount 140. Also, the frame 172 and the mount 140 sandwich the lens 171 and the LED module 150, and the portion of the LED 152 is fit into the recess 173 of the lens 171. In this way, the lens 171 is less likely to be dislocated. This structure is simpler than fixing the lens 171 with additional members such as springs.

The frame 172 is elastic so as to push the lens 171 toward the mount 140. The thickness of the frame 172 is preferably in the range of 0.3 mm to 4.0 mm inclusive. This is because if the frame 172 is thinner than 0.3 mm, the frame 172 will lack in its mechanical strength; and if the frame 172 is thicker than 4.0 mm, the frame 172 will not be elastic enough to push the lens 171.

Note that the frame 172 may be made of a heat dissipating material such as metal or ceramic. In this way, the heat dissipation characteristics of the light source device 100 are further improved. Also, the frame 172 may be made of a light-transmissive material. This makes it possible to emit light from the entirety of a front surface of the light source device 100.

(Assembly Structure)

The light source device 100 in Embodiment 1 described above is assembled as follows. As shown in FIG. 3, the pin terminals 112a and 112b are inserted through the through-holes 144a and 144b of the mount 140, in a state where the lighting unit 110 is housed in the case 120. Then, the pin terminals 112a and 112b are also inserted through the through-holes 154a and 154b of the substrate 151 of the LED module 150. When the pin terminals 112a and 112b are inserted through the through-holes 154a and 154b of the substrate 151, the distal ends 117a and 117b of the pin terminals 112a and 112b enter the respective recesses 166 of the connectors 160 and are connected to the respective conductive members 161. As a result, the pin terminals 112a and 112b are electrically connected to the feed terminals 153a and 153b of the substrate 151, thus securing a feed path from the lighting unit 110 to the LED module 150.

Note that the pin terminals 112a and 112b do not always need to completely penetrate through the through-holes 154a and 154b of the substrate 151. Instead, the pin terminals 112a and 112b may simply be inserted in, but not through the through-holes 154a and 154b. In other words, the distal ends 117a and 117b of the pin terminals 112a and 112b do not always need to protrude from the upper surface 156 of the substrate 151. Instead, the tips of the distal ends 117a and 117b may stay inside the through-holes 154a and 154b.

In a state where the pin terminals 112a and 112b penetrate through the through-holes 144a and 144b of the mount 140 and the through-holes 154a and 154b of the LED module 150, the positions of three components, namely the case 120, the mount 140, and the LED module 150 are determined based on two points at which the pin terminals 112a and 112b are located. If the positions of the aforementioned components are determined based on a single point, the components may rotate about the single point and thus be dislocated from the determined positions. However, by determining the positions of the components based on two points, such dislocation is prevented.

Since the positions of the case 120, the mount 140, and the LED module 150 are determined, (i) the screw holes 128a to 128c of the case 120, (ii) the screw holes 145a to 145c of the mount 140, and (iii) the screw holes 155a to 155c of the substrate 151 of the LED module 150 coincide and communicate with each other. Furthermore, the screw holes 155a and 155b of the substrate 151 coincide and communicate with the respective screw holes 167 of the connectors 160. By inserting screws 180a to 180c into the screw holes 128a to 128c, 145a to 145c, 155a to 155c, and 167, the three components, i.e., the case 120, the mount 140, and the LED module 150 are integrally fixed to each other by the screws 180a to 180c. This simplifies the assembly of the light source device 100. Also, the light source device 100 can be disassembled into the components by simply removing the screws 180a to 180c. This simplifies disassembly of the light source device 100 at the time of recycling or the like.

As for the light source device 100, it is possible to prepare a plurality of types for each component which are different in shape and size but have the through-holes and screw holes at the same positions, and to select components appropriately according to the wattage and the specifications of a lighting fixture and combine the selected components.

Embodiment 2

Figure 6:
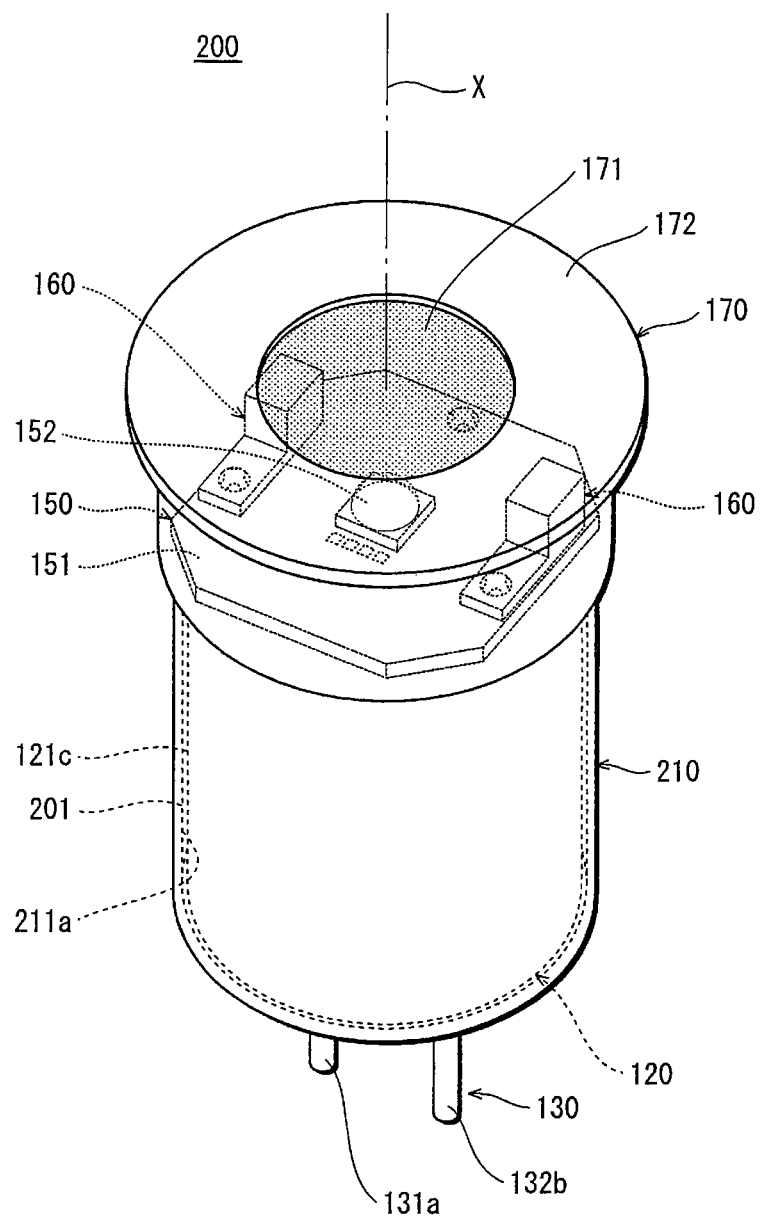
FIG. 6 is a perspective view showing a light source device according to Embodiment 2.
Figure 7:
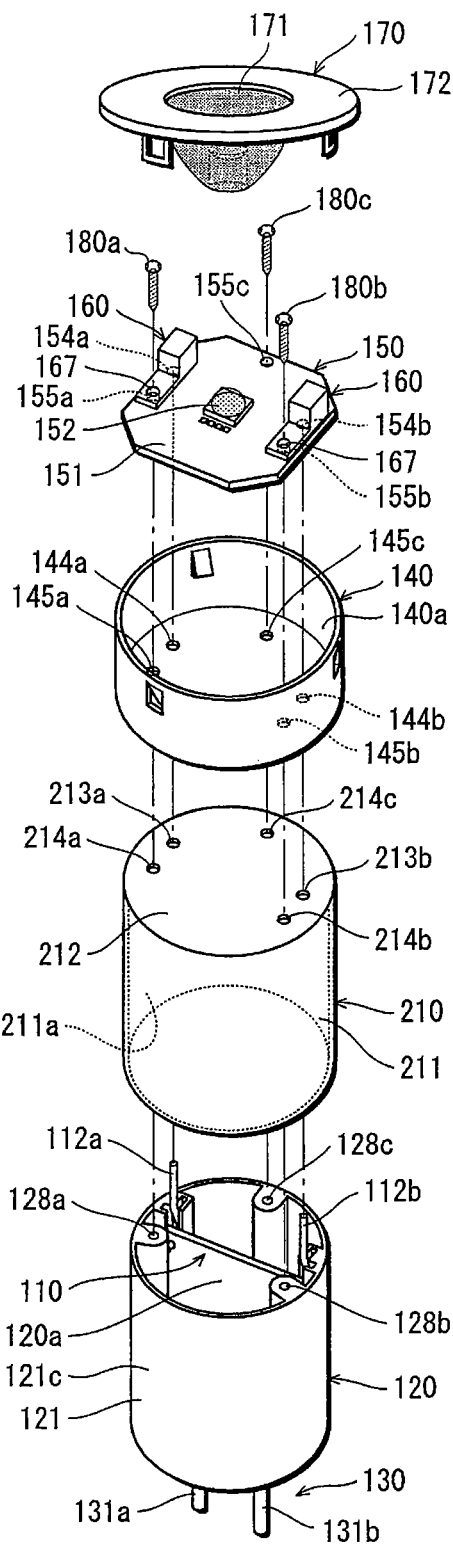
FIG. 7 is an exploded perspective view showing the light source device according to Embodiment 2.

FIG. 6 is a perspective view showing a light source device according to Embodiment 2, and FIG. 7 is an exploded perspective view showing the light source device according to Embodiment 2. As shown in FIGS. 6 and 7, a light source device 200 according to Embodiment 2 is greatly different from the light source device 100 according to Embodiment 1 with respect to a heat sink 210. The following mainly describes the heat sink 210, and a description of structures similar to those in Embodiment 1 is omitted to avoid repetition. Note that the components that are the same as those of Embodiment 1 are assigned the same reference signs.

(Heat Sink)

As shown in FIG. 7, the heat sink 210 includes a cylindrical portion 211 and an end wall 212 that has a disc shape and closes an upper end of the cylindrical portion 211. The heat sink 210 is made of a heat dissipating material such as metal or ceramic. Because of its simple shape, the heat sink 210 can be made thin by a drawing process. This makes it possible to reduce the weight of the light source device 200. Note that the heat sink 210 may be manufactured by a method different from the drawing process, such as die-casting.

The cylindrical portion 211 is fit around the case 120, and covers the entirety of an outer circumferential surface 121c of the cylindrical portion 121 of the case 120. This makes it possible to increase the surface area of the cylindrical portion 211 and thereby improve the heat dissipation characteristics. This structure is particularly beneficial for a light source device used for a spotlight, which tends to have a problem in an increase in temperature caused by heat generated by a small high-luminance LED mounted in the light source device. Note that the cylindrical portion 211 is not limited to having a shape that covers the entirety of the outer circumferential surface 121c of the cylindrical portion 121 of the case 120. Instead, the cylindrical portion 211 may have a shape that partially covers the outer circumferential surface 121c of the cylindrical portion 121.

The cylindrical portion 211 does not cover the bottom portion 122 of the case 120. Accordingly, the heat sink 210 is not a hindrance when the base 130 of the light source device 200 is inserted into a socket (not shown) of a lighting fixture.

There is a gap 201 between an inner circumferential surface 211a of the cylindrical portion 211 of the heat sink 210 and the outer circumferential surface 121c of the cylindrical portion 121 of the case 120. The gap 201 has a substantially equal width along the circumferential direction of the inner circumferential surface 211a. The gap 201 makes it difficult for heat to be transferred from the heat sink 210 to the case 120, resulting in the lighting unit 110 housed in the case 120 being less likely to be damaged by the heat. Also, since the inner circumferential surface 211a of the cylindrical portion 211 of the heat sink 210 and the outer circumferential surface 121c of the cylindrical portion 121 of the case 120 are both exposed to the air, the heat dissipation characteristics of the heat sink 210 are further improved. Note that the width of the gap 201 is preferably in the range of 0.2 mm to 7.0 mm inclusive. If the width of the gap 201 is smaller than 0.2 mm, the heat dissipation characteristics of the heat sink 210 are not effectively improved. If the width of the gap 201 is larger than 7.0 mm, the size of the light source device 200 becomes too large to conform to the standard for halogen light bulbs.

The end wall 212 is interposed between the mount 140 and the case 120 so as to close the opening 120a of the case 120. The end wall 212 has through-holes 213a and 213b and screw holes 214a to 214c. With the pin terminals 112a and 112b penetrating through the through-holes 213a and 213b of the heat sink 210, the screw holes 214a to 214c of the heat sink 210 are respectively in communication with the screw holes 155a to 155c of the substrate 151 of the LED module 150, the screw holes 145a to 145c of the mount 140, and the screw holes 128a to 128c of the case 120. This makes it possible to integrally fix the case 120, the heat sink 210, the mount 140, and the LED module 150 by means of screws 800a to 800c.

The light source device 200 has a structure where the heat sink 210 is provided separately from the mount 140 and the case 120. This structure has the following advantage. Suppose that the light source device 200 comes in a plurality of types each having a different wattage. In this case, the mount 140 and the case 120 may be used for each type of the light source device 200 while the shape and size of the heat sink 210 may be changed according to wattage. This makes it possible to commonalize components among all types of the light source devices 200 and thereby to reduce cost. Also, various types of light source devices 200 can be developed with less difficulty.

(Variation)

Figure 8:
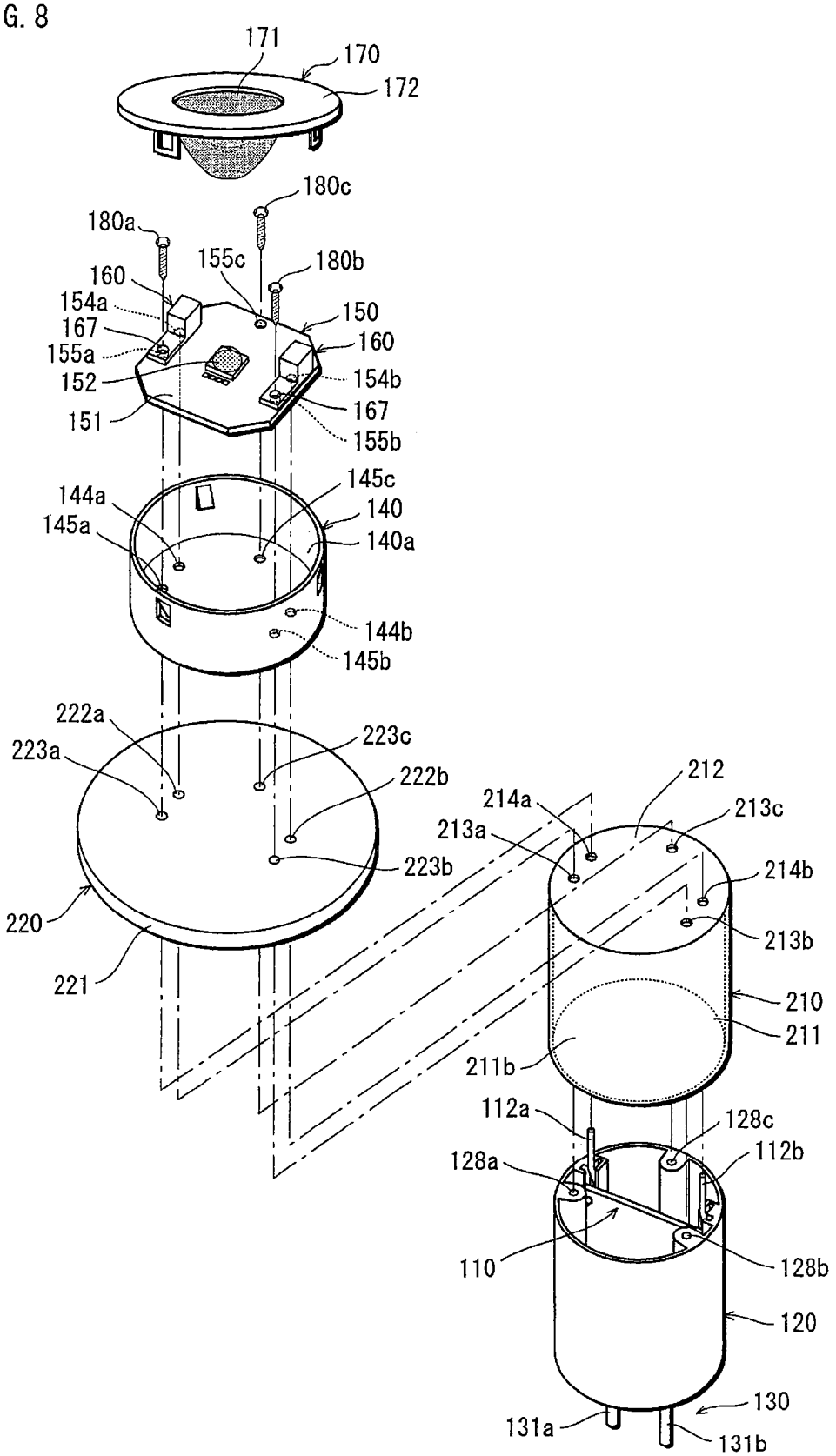
FIG. 8 is an exploded perspective view showing a light source device according to a variation of Embodiment 2.

The light source device 200 may further include one or more heat dissipating plates in addition to the heat sink 210. FIG. 8 is an exploded perspective view of a light source device according to a variation of Embodiment 2. FIGS. 9A to 9d are schematic views for explaining variations of Embodiment 2.

Figure 9A:
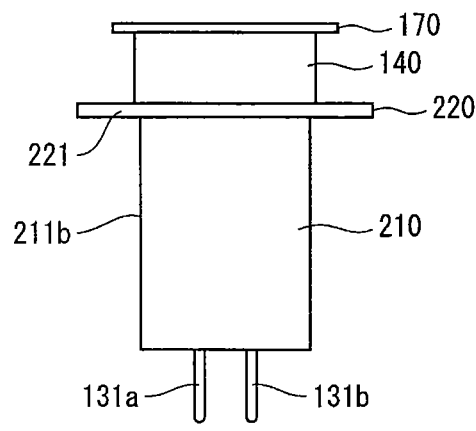
FIGS. 9A to 9D are schematic views for explaining variations of Embodiment 2.

According to the variation 1 shown in FIG. 8 and FIG. 9A, a heat dissipating plate 220 is disposed between the mount 140 and the heat sink 210. The heat dissipating plate 220 is made of a heat dissipating material such as metal or ceramic. The heat dissipating plate 220 has a disc shape, and a circumferential edge 221 thereof extends more outward than an outer circumferential surface 211b of the cylindrical portion 211. A central portion of an upper surface of the heat dissipating plate 220 makes contact with a lower surface of the mount 140, and a central portion of a lower surface of the heat dissipating plate 220 makes contact with an upper surface of the heat sink 210.

In this way, with the heat dissipating plate 220, the heat capacity and surface area of the heat sink 210 are increased by an amount equivalent to the heat dissipating plate 220, resulting in the heat dissipation characteristics of the light source device being improved. Furthermore, since the circumferential edge 221 of the heat dissipating plate 220 extends more outward than the outer circumferential surface 211b of the cylindrical portion 211, a large portion of the surface of the heat dissipating plate 220 is exposed to the air, resulting in the heat dissipation characteristics of the light source device being further improved.

The heat dissipating plate 220 has a pair of through-holes 222a and 222b, and screw holes 223a to 223c. The through-holes 222a and 222b are for inserting the pin terminals 112a and 112b therethrough. The screw holes 223a to 223c communicate with the screw holes 214a to 214c of the heat sink 210, in a state where the pin terminals 112a and 112b penetrate through the through-holes 222a and 222b. This simplifies the assembly of the light source device 200.

Figure 9B:
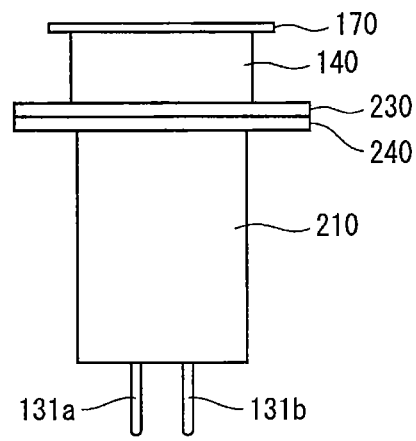

According to the variation 2 shown in FIG. 9B, two heat dissipating plates, namely heat dissipating plates 230 and 240 are disposed between the mount 140 and the heat sink 210. The heat dissipating plates 230 and 240 have, for example, the same shape as the heat dissipating plate 220 of the variation 1. The heat dissipating plate 230 on the side of the mount 140 is made of a material having high heat conductive characteristics, such as graphite. The heat dissipating plate 220 on the side of the heat sink 210 is made of a material having high heat radiation characteristics, such as ceramic. A central portion of an upper surface of the heat dissipating plate 230 makes contact with the lower surface of the mount 140, and an entire lower surface of the heat dissipating plate 230 makes contact with an entire upper surface of the heat dissipating plate 240. A central portion of a lower surface of the heat dissipating plate 240 makes contact with the upper surface of the heat sink 210.

With this structure, heat generated by the LED module 150 is efficiently transferred by the heat dissipating plate 230 to the heat dissipating plate 240. Also, the heat is efficiently dissipated by the heat dissipating plate 240. As a result, the heat dissipation characteristics are further improved.

Figure 9C:
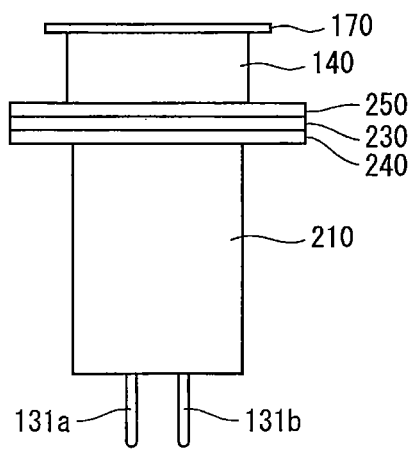

According to the variation 3 shown in FIG. 9C, another heat dissipating plate, namely a heat dissipating plate 250 is disposed in addition to the heat dissipating plates 230 and 240 according to the variation 2. Specifically, the heat dissipating plate 250 is disposed between the mount 140 and the heat dissipating plate 230. The heat dissipating plate 250 has, for example, the same shape as the heat dissipating plate 220 of the variation 1. A central portion of an upper surface of the heat dissipating plate 250 makes contact with the lower surface of the mount 140, and an entire lower surface of the heat dissipating plate 250 makes contact with an entire upper surface of the heat dissipating plate 230. The heat dissipating plate 250 is made of a material having high heat radiation characteristics, such as ceramic.

With this structure, heat generated by the LED module 150 is efficiently transferred by the heat dissipating plate 230 to the heat dissipating plates 240 and 250. Also, the heat is efficiently dissipated by the heat dissipating plates 240 and 250. As a result, the heat dissipation characteristics are further improved.

Figure 9D:
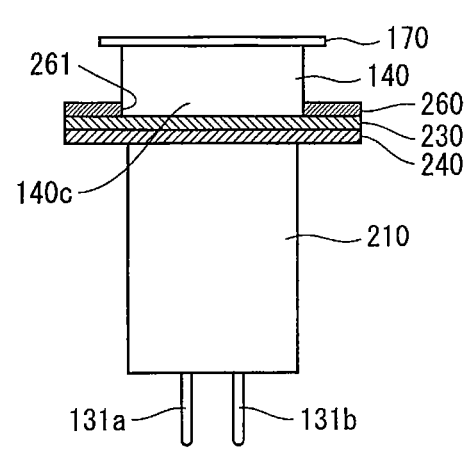

According to the variation 4 shown in FIG. 9D, a heat dissipating plate 260 is disposed instead of the heat dissipating plate 250 according to the variation 3. The heat dissipating plate 260 has an annular plate-like shape, and has an opening 261 at its center. The heat dissipating plate 260 is fit around the mount 140 such that a lower end 140c of the mount 140 is fit in the opening 261. An entire lower surface of the heat dissipating plate 260 makes contact with an upper surface of the heat dissipating plate 230. The heat dissipating plate 260 is made of a material having high heat radiation characteristics, such as ceramic.

With this structure, the contact area between the mount 140 and the heat dissipating plate 230 is larger than in the variation 3. Therefore, heat generated by the LED module 150 is efficiently transferred by the heat dissipating plate 230, resulting in the heat dissipation characteristics being further improved.

According to the variations 1 to 4 as described above, the number, size, shape, and material of the heat dissipating plates 220, 230, 240, 250, and 260 may be changed to adjust the heat dissipation characteristics appropriately. In this way, the heat dissipating plates 220, 230, 240, 250, and 260 are applicable to a plurality of types of light source devices that each have a different wattage and a different heat value.

As a result, the case 120, the mount 140, and the heat sink 210 can be commonly used while the number, size, etc. of the heat dissipating plates 220, 230, 240, 250, and 260 are changed according to a type of light source device. This makes it possible to commonalize components and thereby to prevent an increase in the cost of metal molds and reduce cost. Also, various types of light source devices can be developed with less difficulty.

Figure 10A:
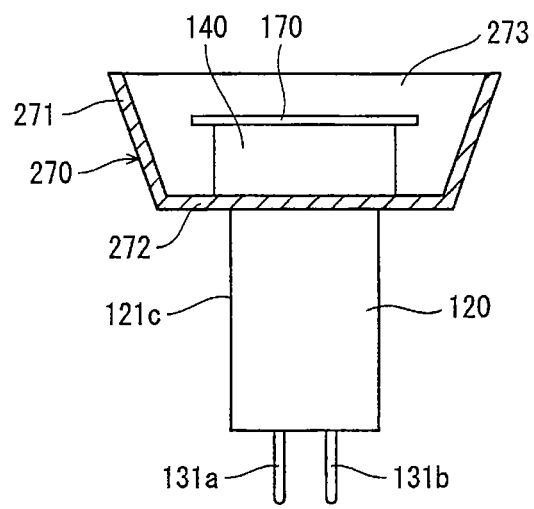
FIGS. 10A and 10B are schematic views for explaining the variations of Embodiment 2.
Figure 10B:
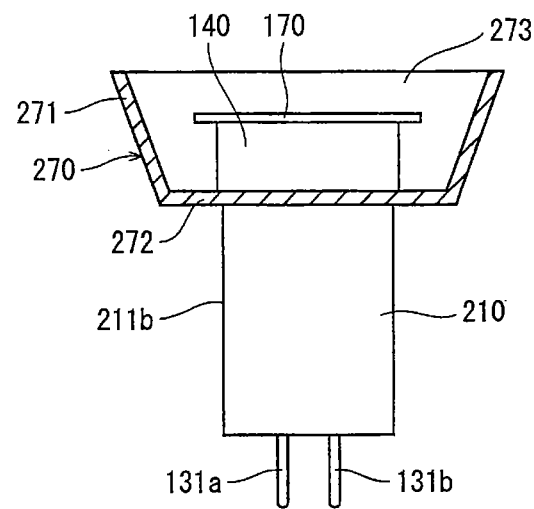

FIGS. 10A and 10b are schematic views for explaining variations of Embodiment 2. A heat sink according to the present invention is not limited to having a shape as seen in the heat sink 210 shown in FIG. 8, i.e., a shape that allows the heat sink to house therein the case 120. For example, a heat sink according to the present invention may have a shape as seen in a heat sink 270 shown in FIG. 10A, i.e., a shape that allows the heat sink to house therein the mount 140 and the cover 170.

The heat sink 270 has a bowl shape, and has a tubular portion 271 and an end wall 272. The diameter of the tubular portion 271 increases as it extends upward. The end wall 272 has a disc shape and closes a lower end of the tubular portion 271. The heat sink 270 is made of a heat dissipating material such as metal or ceramic. Note that an opening 273 of the heat sink 270 may be covered by a cover or the like.

Furthermore, a heat sink according to the present invention may have a structure as shown in FIG. 10B. According to this structure, the heat sink includes both the heat sink 210 shown in FIG. 8 and the heat sink 270 shown in FIG. 10A.

Embodiment 3

Figure 11:
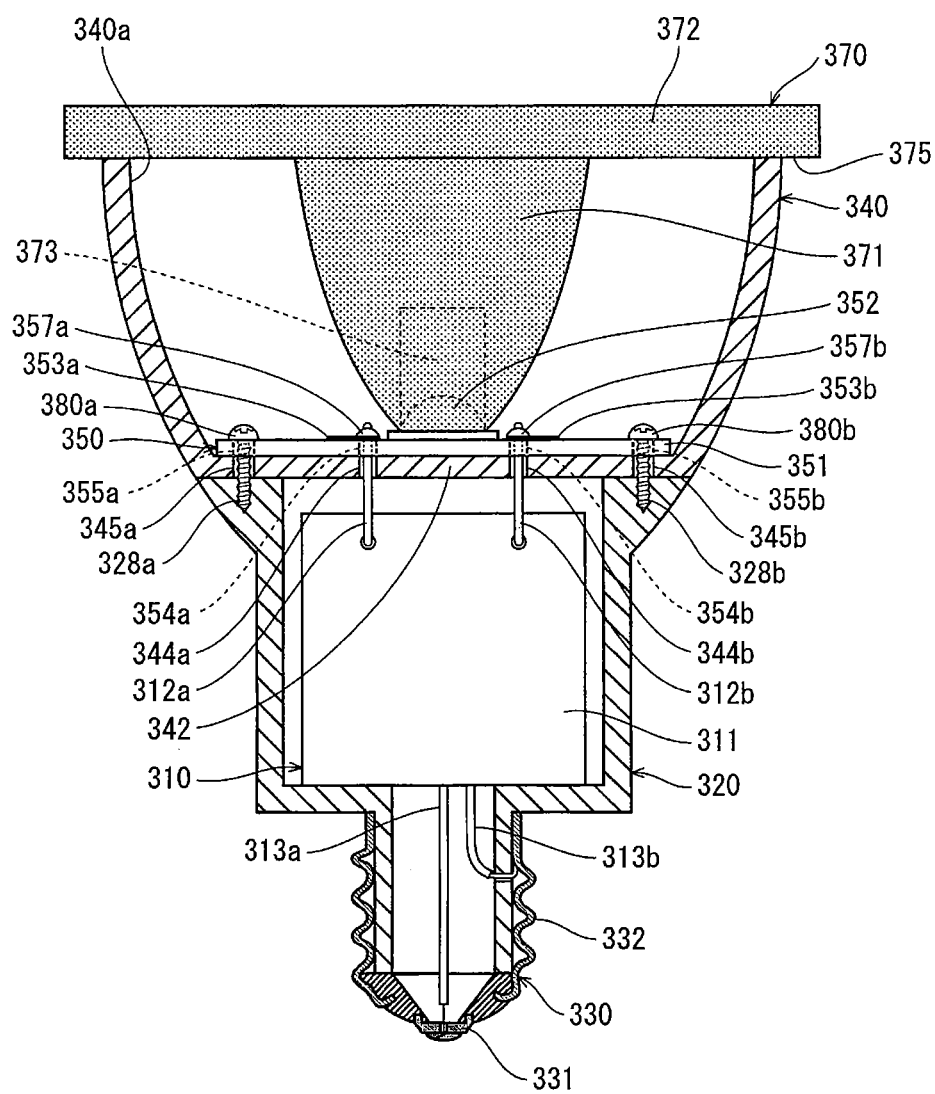
FIG. 11 is a sectional view showing a light source device according to Embodiment 3.

FIG. 11 is a sectional view showing a light source device according to Embodiment 3. As shown in FIG. 11, a light source device 300 according to Embodiment 3 is a substitute for a halogen light bulb, and has an outer shape that conforms to the standard for halogen light bulbs. The light source device 300 includes a lighting unit 310, a case 320, a base 330, a mount 340, an LED module (light emitting module) 350, and a cover 370.

The lighting unit 310 includes a circuit board 311, a pair of pin terminals 312a and 312b, and a pair of lead wires 313a and 313b. The pin terminals 312a and 312b serve as feed terminals for supplying power to the LED module 350, and also as positioning pins for positioning the mount 340 and the LED module 350 with respect to the case 320. Specifically, the pin terminals 312a and 312b are inserted through through-holes 344a and 344b of the mount 340 and through through-holes 354a and 354b of the LED module 350, whereby the mount 340 and the LED module 350 are positioned with respect to the case 320.

The case 320 has, for example, a tubular shape with both upper and lower ends open, and has screw holes 328a and 328b.

The base 330 is of a screw type adaptable to a socket for a halogen light bulb. The base 330 has a two-point contact structure for receiving an AC power from the commercial power source. Specifically, a tip 331 of the base 330 is connected to the lead wire 313a of the lighting unit 310, and a screw portion 332 of the base 330 is connected to the lead wire 313b of the lighting unit 310. The base 330 is attached to the case 320 by a known method such as swaging or using an adhesive. Examples of the base 330 for a halogen light bulb include E11, EZ10, GU5.3, and GU10.

The mount 340 has a bowl shape, and the LED module 350 is mounted on an upper surface of a bottom portion 342 of the mount 340, which is an inner bottom surface of the bowl-shaped mount 340. Also, the through-holes 344a and 344b are formed in the bottom portion 342. A gap between the through-holes 344a and 344b is the same as a gap between the pin terminals 312a and 312b. In a state where the light source device 300 has been assembled, the pin terminals 312a and 312b penetrate through the through-holes 344a and 344b.

Also, two screw holes, i.e., screw holes 345a and 345b, are formed in the bottom portion 342. The screw holes 345a and 345b are for fixing the mount 340 to the case 320. In a state where the light source device 300 has been assembled, the screw holes 345a and 345b of the mount 340 are respectively in communication with the screw holes 328a and 328b of the case 320.

The LED module 350 is a light source of the light source device 300, and includes, for example, a substrate 351, an LED (light emitting element) 352, and a pair of feed terminals 353a and 353b. The through-holes 354a and 354b and two screw holes, i.e., screw holes 355a and 355b are formed in the substrate 351. The through-holes 354a and 354b are for inserting the pin terminals 312a and 312b therethrough, and the screw holes 355a and 355b are for attaching the LED module 350 to the mount 340.

In a state where the light source device 300 has been assembled, the pin terminals 312a and 312b penetrate through the through-holes 354a and 354b, and the screw holes 355a and 355b are respectively in communication with the screw holes 345a and 345b of the mount 340. A gap between the through-holes 354a and 354b is the same as a gap between the pin terminals 312a and 312b.

The feed terminals 353a and 353b are electrically connected to the pin terminals 312a and 312b by solder 357a and solder 357b.

The cover 370 is, for example, made of a material that transmits and diffuses light. The cover 370 includes a lens (optical component) 371 substantially in an inverted frusto-conical shape, and a frame 372 in the shape of an annular plate which extends outward from an outer circumferential surface of the lens 371. An upper surface of the lens 371 is flush with an upper surface of the frame 372. The cover 370 is attached to the mount 340 so as to cover the LED module 350 and close an opening 340a of the mount 340. The cover 370 is attached in a state where a lower surface 375 of the frame 372 is in contact with the mount 340.

Since the cover 370 is entirely made of a light-transmissive material, light is emitted from the entirety of a front surface of the light source device 300. This makes it possible to ensure that the light emitting state of the light source device 300 is similar to that of a halogen light bulb or an incandescent light bulb. Also, since leak light (approximately 10% of the amount of light emission) that does not enter the lens 371 passes through the frame 372 and is emitted outside, the amount of light irradiation is increased. Furthermore, since the cover 370 is made of a light-diffusing material, emitted light is diffused by the cover 370. This realizes a light distribution pattern similar to an incandescent light bulb.

Embodiment 4

Figure 12:
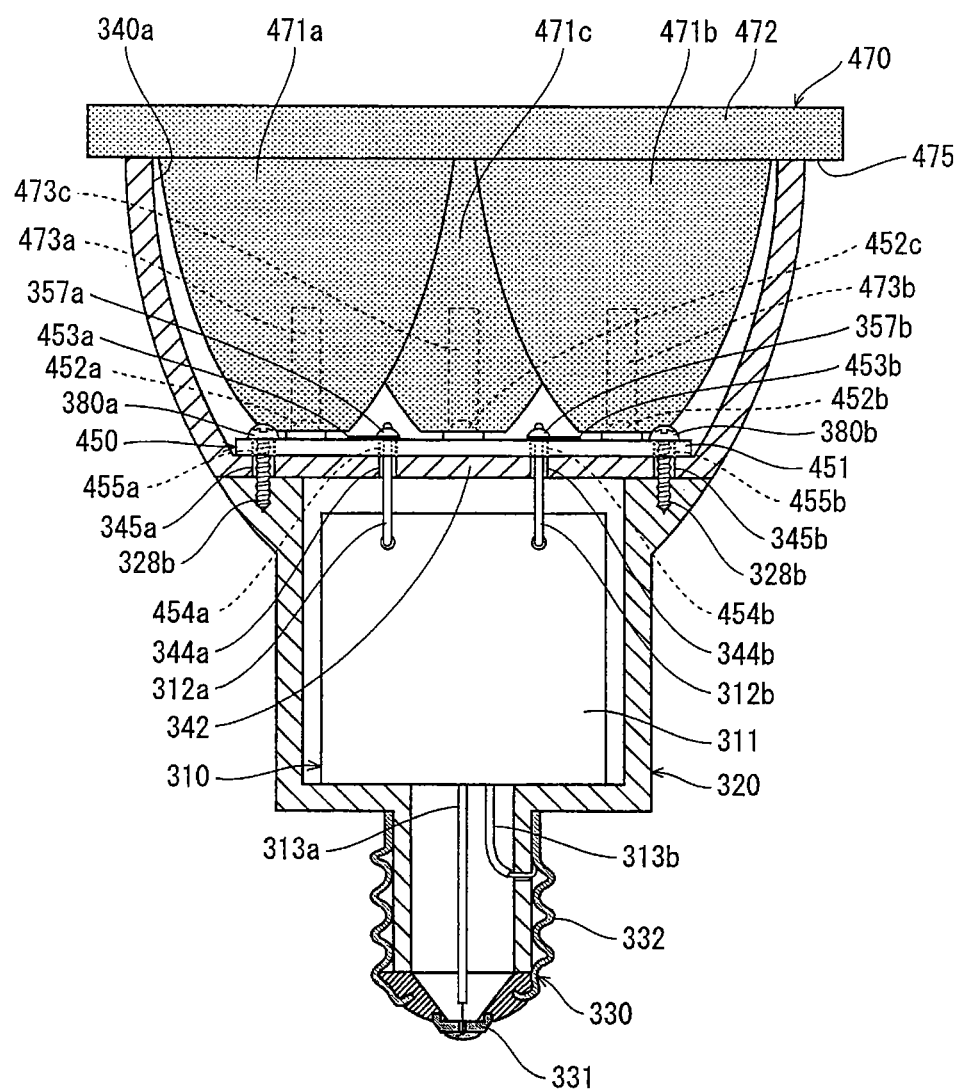
FIG. 12 is a sectional view showing a light source device according to Embodiment 4.
Figure 13:
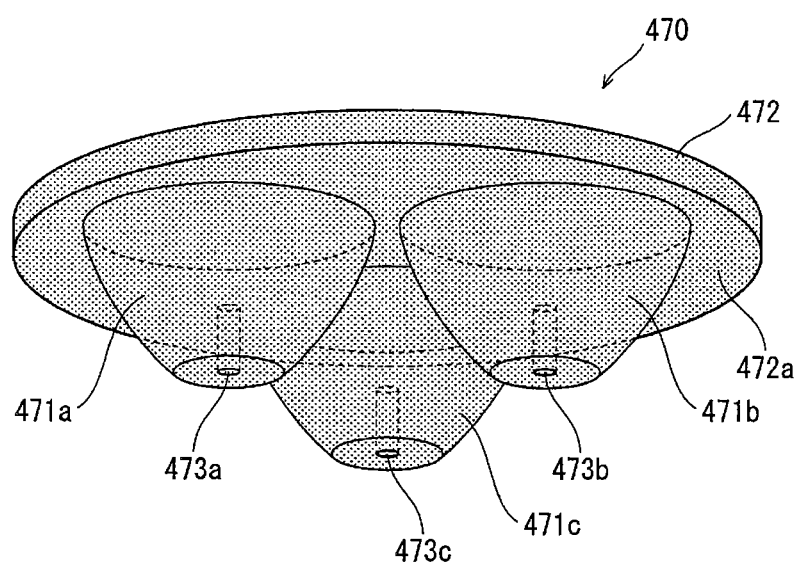
FIG. 13 is a perspective view showing a cover according to Embodiment 4.

FIG. 12 is a sectional view showing a light source device according to Embodiment 4. FIG. 13 is a perspective view showing a cover according to Embodiment 4. As shown in FIG. 12, a light source device 400 according to Embodiment 4 is greatly different from the light source device 300 according to Embodiment 3 with respect to three LEDs, i.e., LEDs 452a to 452c, and three lenses, i.e., lenses 471a to 471c. The following mainly describes an LED module 450 and a cover 470, and a description of structures similar to those in Embodiment 3 is omitted to avoid repetition. Note that the components that are the same as those of Embodiment 3 are assigned the same reference signs.

The LED module 450 is a light source of the light source device 400, and includes, for example, a substrate 451, the LEDs 452a to 452c, and a pair of feed terminals 453a and 453b. Through-holes 454a and 454b and two screw holes, i.e., screw holes 455a and 455b are formed in the substrate 451. The through-holes 454a and 454b are for inserting the pin terminals 312a and 312b therethrough, and the screw holes 455a and 455b are for attaching the LED module 450 to the mount 340.

As shown in FIG. 13, the cover 470 is, for example, made of a material that transmits and diffuses light. The cover 470 includes the lenses 471a to 471c that are each substantially in an inverted frusto-conical shape, and a plate-like frame 472 for integrally connecting the lenses 471a to 471c. The cover 470 is attached to the mount 340 so as to cover the LED module 450 and close the opening 340a of the mount 340. The cover 470 is attached in a state where a lower surface 475 of the frame 472 is in contact with the mount 340.

As described above, the number of LEDs may be more than one, as seen in the LEDs 452a to 452c. Also, the number of lenses may also be more than one, as seen in the lenses 471a to 471c, in accordance with the number of LEDs. With the LEDs 452a to 452c respectively corresponding to the lenses 471a to 471c, light emitted from the LEDs 452a to 452c is more efficiently converged.

Embodiment 5

Regarding a light source device according to the present invention, (i) the electric connection between the light emitting module and the lighting unit and (ii) positioning of the light emitting module and the case with respect to the mount are not limited to being achieved by use of the pin terminals of the lighting unit.

Figure 14A:
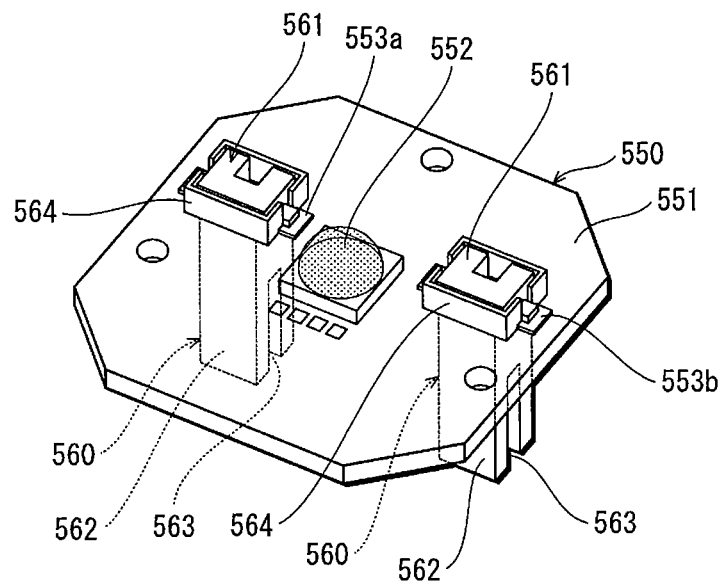
FIGS. 14A and 14B show connectors of a light source device according to Embodiment 5.
Figure 14B:
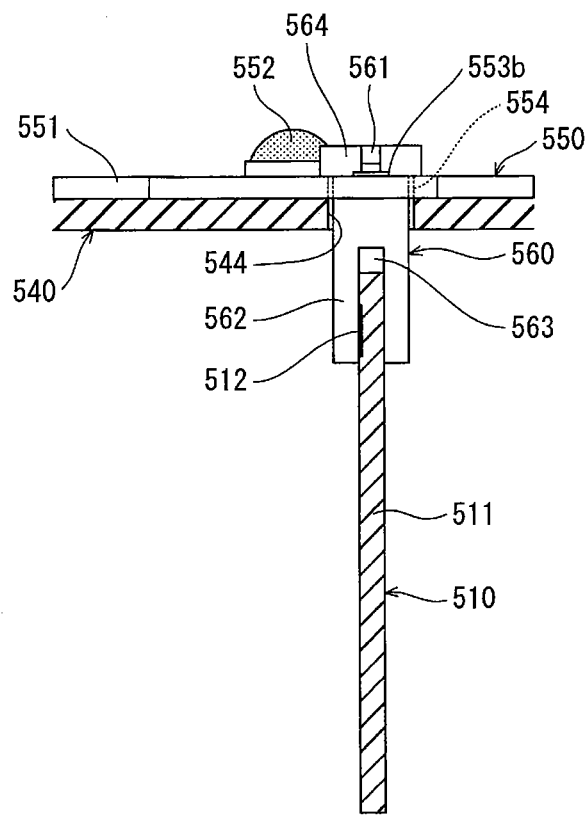

FIGS. 14A and 14B show connectors of a light source device according to Embodiment 5, where FIG. 14A is a perspective view showing a state where the connectors have been mounted on the light emitting module and FIG. 14B is a schematic diagram for explaining a state where the connectors have been engaged with the lighting unit. As shown in FIGS. 14A and 14B, the light source device according to Embodiment 5 is greatly different from the light source device 100 according to Embodiment 1, with respect to a pair of connectors 560. The following only describes the difference, and a description of structures similar to those in Embodiment 1 is omitted to avoid repetition.

A lighting unit 510 has a circuit board 511 on which a pair of electrodes 512 (only one electrode being shown) are formed with a space therebetween. More specifically, each of the electrodes 512 is arranged in the vicinity of an upper side edge of the circuit board 511. A mount 540 has a pair of through-holes 544 substantially in a quadrilateral shape (only one through-hole being shown). An LED module 550 includes a substrate 551, an LED 552, and a pair of feed terminals 553a and 553b. A pair of through-holes 554 (only one through-hole being shown) substantially in a quadrilateral shape are formed in the substrate 551.

The connectors 560 are substantially in a prismatic shape, and are attached to the substrate 551 in a state where the connectors 560 penetrate through the respective through-holes 554 of the substrate 551. A proximal end 561 of each connector 560 protruding from an upper surface of the substrate 551 is wider than the corresponding through-hole 554 of the substrate 551. This prevents the connectors 560 from slipping out of the through-holes 554 and drop. The proximal ends 561 are electrically connected to the feed terminals 553a and 553b of the LED module 550.

A distal end (tip end) 562 of each connector 560, which protrudes toward an opposite side from the LED 552, is engaged with the lighting unit 510. Specifically, the engagement is established by fitting the upper side edge of the circuit board 511 into slits 563 formed in the respective distal ends 562, in a state where the connectors 560 penetrate through the respective through-holes 554 of the mount 540. In a state where the distal ends 562 of the connectors 560 are engaged with the lighting unit 510, inner surfaces of the slits 563 of the distal ends 562 make contact with the respective electrodes 512, resulting in the LED module 550 being electrically connected to the lighting unit 510 via the connectors 560.

Note that the substrate 551 is provided with insulating walls 564, each of which surrounds a corresponding one of the proximal ends 561 of the connectors 560.

In the stated structure, the LED module 550 is electrically connected to the lighting unit 510, and the positions of the mount 540, the LED module 550, and the case fixed to the lighting unit 510 are determined, by simply inserting the distal ends 562 of the connectors 560 attached to the LED module 550 through the respective through-holes 544 of the mount 540, and also fitting the circuit board 511 of the lighting unit 510 into the slits 563 of the distal ends 562.

Embodiment 6

Figure 15A:
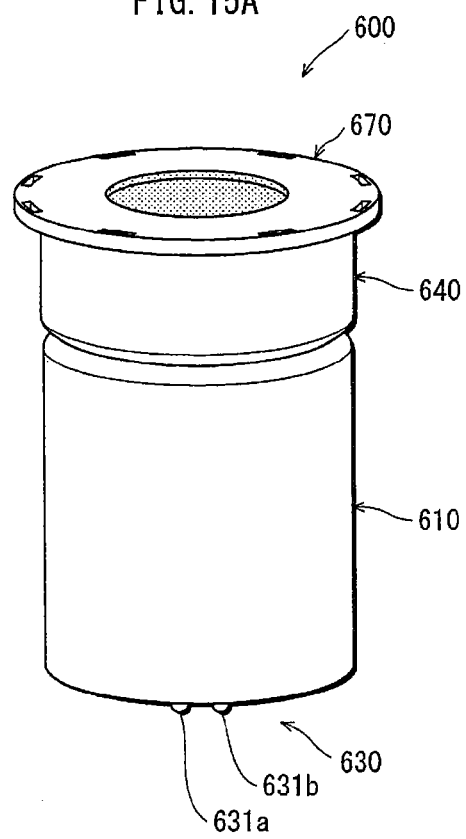
FIGS. 15A and 15B show a light source device according to Embodiment 6.
Figure 15B:
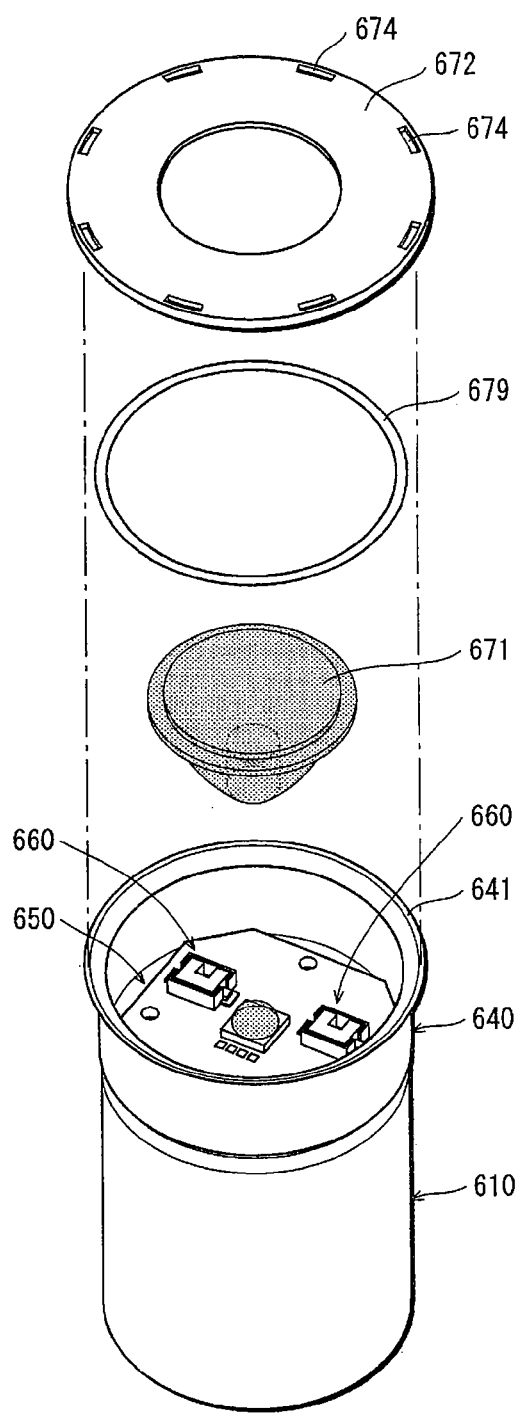
Figure 16A:
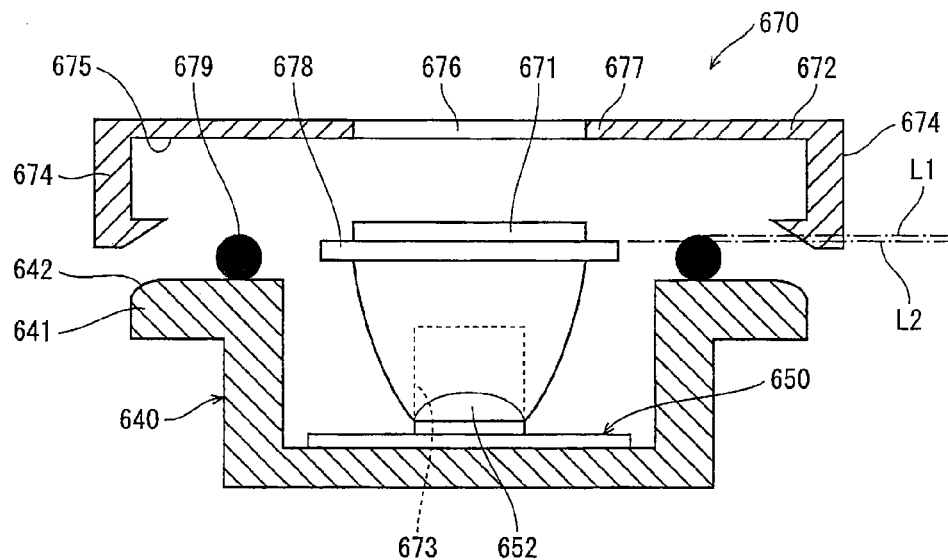
FIGS. 16A and 16B show states before and after a cover is attached.
Figure 16B:
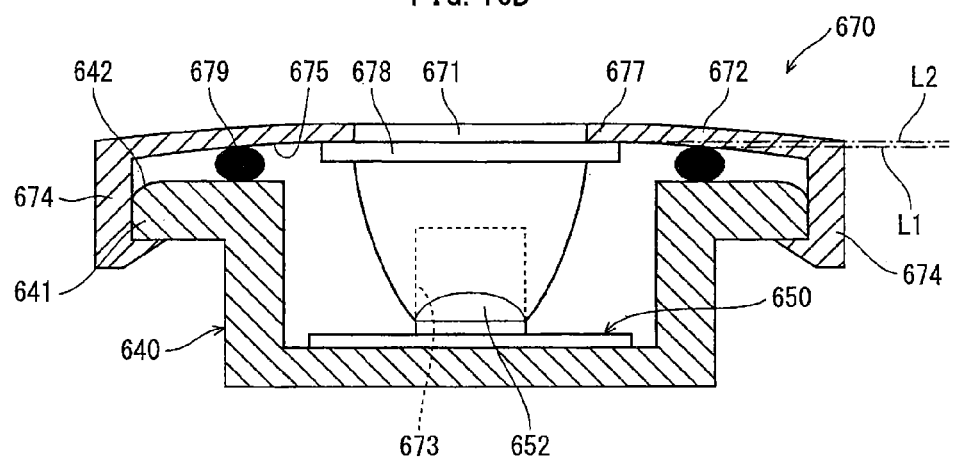

FIGS. 15A and 15B show a light source device according to Embodiment 6, where FIG. 15A is a perspective view and FIG. 15B is an exploded perspective view. FIGS. 16A and 16B are for explaining a manner of attaching a cover, where FIG. 16A shows a state before the cover is attached, and FIG. 16B shows a state after the cover is attached.

A light source device 600 according to Embodiment 6, which is shown in FIGS. 15A and 15B, is greatly different from the light source device according to Embodiment 5 with respect to a manner of attaching a cover 670. The following only describes the difference, and a description of structures similar to those in Embodiment 5 is omitted to avoid repetition.

The light source device 600 includes a lighting unit (not shown), a case (not shown), a heat sink 610, a base 630 having a pair of base pins 631a and 631b, a mount 640, an LED module 650, a pair of connectors 660, and the cover 670.

The cover 670 includes a lens 671, a frame 672, and an O-ring 679. Also, eight latching claws 674 are arranged on an outer circumferential edge of the frame 672. The latching claws 674 protrude downward from a lower surface 675 of the frame 672, and are arranged along the circumferential direction of the frame 672 at equal intervals.

The cover 670 is attached in the following manner. As shown in FIG. 16A, the LED module 650 is attached to the mount 640. Then, the lens 671 is mounted on the LED module 650 such that a part of an LED 652 is fit in a recess 673. Next, the frame 672 is arranged such that the lens 671 is exposed from an opening 676 of the frame 672. Then, an outer circumferential edge 678 of the lens 671 is pushed by an inner circumferential edge 677 of the frame 672 so as to cause the latching claws 674 to latch an opening edge 641 of the mount 640. In this way, the frame 672 is attached to the mount 640. The opening edge 641 of the mount 640 extends outward so as to be latched by the latching claws 674.

An upper surface 642 of the opening edge 641 of the mount 640 is rounded, so that when the latching claws 674 of the frame 672 latch the opening edge 641, the latching claws 674 smoothly go under the opening edge 641. With this structure, the latching claws 674 are less likely to be damaged when the cover 670 is to be attached.

The O-ring 679, which is made of rubber, for example, is arranged between the mount 640 and the frame 672. Before the frame 672 is attached, a height level L1 at an upper end of the O-ring 672 is higher than a height level L2 at an upper surface of the outer circumferential edge 678 of the lens 671. However, after the frame 672 is attached, the height level L1 is lower than the height level L2. In other words, the O-ring 679 is flattened by being pressed by the lower surface 675 of the frame 672. As described above, since the O-ring 679 is arranged between the mount 640 and the frame 672, an inner space formed by the mount 640 and the cover 670 is airtight. With this structure, the LED module 650 is arranged in the airtight inner space, resulting in the LED module 650 being less likely to break due to moisture even when the light source device 600 is used in a high-humidity environment.

Modifications

Although having been described based on the specific embodiments, the light source device according to the present invention is not limited to the above embodiments. For example, the following Modifications are possible.

(Light Emitting Element)

The light emitting element according to the present invention is not limited to the LED, but may be a semiconductor laser diode or an electroluminescent element. Also, the luminescent color of the light emitting element is not limited to white, but may be any luminescent color.

(Mount)

The mount may be made of a light-transmissive material. In this case, the light emitted from the light emitting module passes through the mount and also leaks sideways. This broadens the illumination range of the light source device. Note that the light-transmissive material may be light-transmissive ceramic such as glass. Such a structure is particularly effective when the light source device is not used for a spotlight. In this case, the mount is preferably made of a light-diffusing material. Furthermore, the above structure is particularly effective in combination with a cover that transmits and diffuses light.

(Cover)

In a case where the optical component of the cover is lens, it is preferable that a reflective film for reflecting light is provided on a surface of the lens. With the reflective film, the surface of the lens acts as a concave mirror. This increases the amount of light irradiation. Also, the optical component of the cover may be a Fresnel lens or a reflector. Furthermore, the cover may not include the optical component. Also, the light source device may not include the cover.

(Others)

The light source device of the present invention may be any combination of the structural elements of Embodiments 1 through 6 and Modifications thereof.

INDUSTRIAL APPLICABILITY

The light source device according to the present invention is extensively useful for lighting in general.

REFERENCE SIGNS LIST 100 light source device
110 lighting unit
111a and 111b side edges
112a and 112b pin terminals
120 case
121a inner circumferential surface
121c outer circumferential surface
124a and 124b rail grooves
130 base
131a and 131b base pins
140 mount
142 bottom portion
144a and 144b through-holes
145a to 145c screw holes
150 light emitting module
151 substrate
152 light emitting element
153a and 153b feed terminals
154a and 154b through-holes
155a to 155c screw holes
170 cover
171 optical component
172 frame
177 inner circumferential edge
178 outer circumferential edge
201 gap
210 heat sink
211a inner circumferential surface
211b outer circumferential surface
212 end wall
220, 230, 240, 250, and 260 heat dissipating plate
221 circumferential edge
674 latching claws
641 opening edge
642 upper surface
800a to 800c screws

The invention claimed is:

1. A light source device comprising: a light emitting module having a light emitting element and a substrate on which the light emitting element is mounted; a mount on which the light emitting module is mounted; a lighting unit for lighting the light emitting module; a case housing therein the lighting unit and being disposed opposite the light emitting module with respect to the mount, and a heat sink facing the mount, wherein the heat sink has a tubular shape with an opening at one end and an end wall at another end, and is fit around the case such that the end wall is positioned between the mount and the case, and the lighting unit has a pair of pin terminals, each of the end wall of the heat sink, the mount, and the substrate has a pair of through-holes, and a pair of feed terminals are disposed at positions of the substrate corresponding to the through-holes, the pair of pin terminals being electrically connected to the pair of feed terminals by penetrating through the through-holes of the heat sink, the mount, and the substrate, and the case, the heat sink, the mount and the substrate are integrally fixed to each other by a screw.

2. The light source device of claim 1 wherein
each of the case, the heat sink, the mount, and the substrate has a hole for the screw that is in communication with each other in a state where the pair of pin terminals penetrate through the pair of through-holes of each of the heat sink, the mount, and the substrate.

3. The light source device of claim 1 wherein
the case is tubular, and an outer peripheral surface of the case and an inner peripheral surface of the heat sink have a gap therebetween.

4. The light source device of claim 1 further comprising
at least one heat dissipating plate interposed between the mount and the heat sink, the heat dissipating plate having a pair of through-holes through which the pair of pin terminals penetrate.

5. The light source device of claim 1 further comprising
a cover that covers the light emitting module.

6. The light source device of claim 5 wherein
the cover has an optical component that converges light emitted from the light emitting element.

7. The light source device of claim 6 wherein
the cover has an annular frame fixed to the mount, the cover regulating a movement of the optical component by an inner peripheral edge of the annular frame pushing an outer peripheral edge of the optical component toward the light emitting module and thereby pushing the optical component against one of the light emitting module and the mount.

8. The light source device of claim 7 wherein
the annular frame is made of a material that transmits and diffuses light.

9. The light source device of claim 7 wherein
the annular frame is made of one of ceramic and resin.

10. The light source device of claim 1 wherein
the mount has a bottomed tubular shape with an opening at one end and a bottom portion at another end, and the light emitting module is mounted on an inner surface of the bottom portion the mount.

11. The light source device of claim 1 further comprising
a cover having a latching claw and being attached to the mount by the latching claw so as to cover the light emitting module, wherein
the mount has a bottomed tubular shape with an opening at one end and a bottom portion at another end, the light emitting module is mounted on an inner surface of the bottom portion the mount, a peripheral edge of the opening extends outward, an upper surface of the peripheral edge is rounded, and the latching claw latches the peripheral edge of the opening.

12. The light source device of claim 1 further comprising
a base attached to the case.

13. The light source device of claim 12 wherein
the base is composed of a pair of base pins protruding from the case toward an opposite side from the light emitting module, and the case is made of an insulating material.

14. The light source device of claim 1 wherein
a pair of rail grooves that oppose each other have been formed in an inner peripheral surface of the case, and
the lighting unit has a circuit board and is housed in the case in a state where a pair of opposed side edges of the circuit board are fit in the pair of rail grooves.

15. A light source device comprising: a light emitting module having a light emitting element and a substrate on which the light emitting element is mounted; a mount on which the light emitting module is mounted; a lighting unit for lighting the light emitting module; and a case housing therein the lighting unit and being disposed opposite the light emitting module with respect to the mount, wherein a pair of connectors are attached to the light emitting module and protrude from the substrate toward an opposite side from the light emitting element, and the mount has a pair of through-holes, each of the connectors including an engaging member and being engaged with the lighting unit by the engaging member in a state where the pair of connectors penetrate through the pair of through-holes, and the light emitting module is electrically connected to the lighting unit, the light source device further comprises a cover having a latching claw and being attached to the mount by the latching claw so as to cover the light emitting module, and the mount has a bottomed tubular shape with an opening at one end and a bottom portion at another end, the light emitting module is mounted on an inner surface of the bottom portion, a peripheral edge of the opening extends outward, an upper surface of the peripheral edge is rounded, and the latching claw latches the peripheral edge of the opening.

16. The light source device of claim 15 wherein
the cover has an optical component that converges light emitted from the light emitting element.

17. The light source device of claim 16 wherein
the cover has an annular frame fixed to the mount, the cover regulating a movement of the optical component by an inner peripheral edge of the annular frame pushing an outer peripheral edge of the optical component toward the light emitting module and thereby pushing the optical component against one of the light emitting module and the mount.

18. The light source device of claim 17 wherein
the annular frame is made of a material that transmits and diffuses light.

19. The light source device of claim 17 wherein
the annular frame is made of one of ceramic and resin.

* * * * *